(12) United States Patent
Endoh et al.

(10) Patent No.: US 8,578,308 B2
(45) Date of Patent: Nov. 5, 2013

(54) VERIFICATION APPARATUS AND VERIFICATION METHOD

(75) Inventors: Yusuke Endoh, Kawasaki (JP); Takeo Imai, Tokyo (JP); Hideji Kawata, Akishima (JP); Noritaka Kawakatsu, Sakura (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 1227 days.

(21) Appl. No.: 12/163,486

(22) Filed: Jun. 27, 2008

(65) Prior Publication Data

US 2009/0019406 A1    Jan. 15, 2009

(30) Foreign Application Priority Data

Jun. 28, 2007  (JP) ................................ 2007-171113

(51) Int. Cl.
*G06F 17/50* (2006.01)
*G06F 17/10* (2006.01)

(52) U.S. Cl.
USPC ........... 716/106; 716/100; 716/102; 716/103; 716/136; 703/2; 703/13; 703/14

(58) Field of Classification Search
USPC ........ 716/100, 102, 103, 106, 136; 703/2, 13, 703/14
See application file for complete search history.

(56) References Cited

U.S. PATENT DOCUMENTS

| | | | |
|---|---|---|---|
| 6,408,403 B1 * | 6/2002 | Rodrigues et al. | 714/38.11 |
| 6,421,808 B1 * | 7/2002 | McGeer et al. | 716/100 |
| 6,584,436 B2 * | 6/2003 | Hellestrand et al. | 703/13 |
| 6,591,403 B1 * | 7/2003 | Bass et al. | 716/102 |
| 7,000,213 B2 * | 2/2006 | Banerjee et al. | 716/103 |
| 7,055,116 B2 * | 5/2006 | Marschner et al. | 716/106 |
| 7,143,373 B2 * | 11/2006 | Moorby | 716/106 |
| 7,454,727 B1 * | 11/2008 | Cerny et al. | 716/106 |
| 7,539,602 B2 * | 5/2009 | Willis | 703/2 |
| 7,725,851 B2 * | 5/2010 | Eisner et al. | 716/106 |
| 7,926,020 B1 * | 4/2011 | Lu et al. | 716/136 |
| 8,219,376 B2 * | 7/2012 | Pidan et al. | 703/14 |
| 8,418,121 B2 * | 4/2013 | Levitt et al. | 716/136 |
| 2002/0019969 A1 * | 2/2002 | Hellestrand et al. | 716/5 |

(Continued)

FOREIGN PATENT DOCUMENTS

JP    2005-108007 A    4/2005
JP    2006-172113 A    6/2006

(Continued)

OTHER PUBLICATIONS

Extended European Search Report corresponding to European Patent Application No. 08011516.5-2224 dated Nov. 19, 2008.

(Continued)

*Primary Examiner* — Helen Rossoshek

(74) *Attorney, Agent, or Firm* — Ohlandt, Greeley, Ruggiero & Perle, L.L.P.

(57) ABSTRACT

A variable is allocated to a statement that designates an event associated with a function call in an assertion. Generation of the event at an arbitrary time on a continuous time series is detected, and a value corresponding to a meaning of the statement is assigned to the variable. Whether or not a condition corresponding to the meaning of the statement is satisfied is determined based on the value of the variable at each time on a discrete time series.

18 Claims, 9 Drawing Sheets

(56) References Cited

U.S. PATENT DOCUMENTS

| | | | |
|---|---|---|---|
| 2003/0226124 A1* | 12/2003 | Marschner et al. | 716/4 |
| 2006/0247907 A1* | 11/2006 | Qadeer et al. | 703/22 |
| 2006/0277534 A1 | 12/2006 | Kasuya | 717/143 |
| 2007/0074137 A1* | 3/2007 | Nishida et al. | 716/5 |
| 2007/0074141 A1* | 3/2007 | Takei | 716/18 |
| 2008/0104556 A1* | 5/2008 | Yamada | 716/5 |
| 2008/0243470 A1* | 10/2008 | Iwashita | 703/27 |
| 2011/0071974 A1* | 3/2011 | Iwamasa | 706/47 |
| 2013/0019216 A1* | 1/2013 | Vasudevan et al. | 716/106 |

FOREIGN PATENT DOCUMENTS

| | | |
|---|---|---|
| JP | 2006-285333 A | 10/2006 |
| JP | 2007-94591 | 4/2007 |
| JP | 2007-94891 | 4/2007 |
| WO | WO03/100704 | 12/2003 |
| WO | WO2006/035854 | 4/2006 |

OTHER PUBLICATIONS

Hekmatpour, A., et al., "Block-based Schema-driven Assertion Generation for Functional Verification," Proceedings of the 14th Asian Test Symposium, Asian Calcutta, India Dec. 18-21, 2005, pp. 34-39.

Datta, K., et al., "Assertion Based Verification Using HDVL," Proceedings of the 17th International Conference on VLSI Design, Mumbai, India Jan. 5-9, 2004, pp. 319-325.

Pixley, C., et al., "Functional Verification 2003: Technology, Tools and Methodology," ASIC, 2003, Proceedings 5th International Conference, Oct. 21-24, 2003, vol. 1, pp. 1-5.

Peryer, M., et al., "A path out of the verification wilderness," Computing and Control Engineering, IET Publ. Group, vol. 2, No. 2, May 1, 2004, pp. 33-37.

Japanese Office Action dated Feb. 1, 2012 from JP 2007-171113.

* cited by examiner

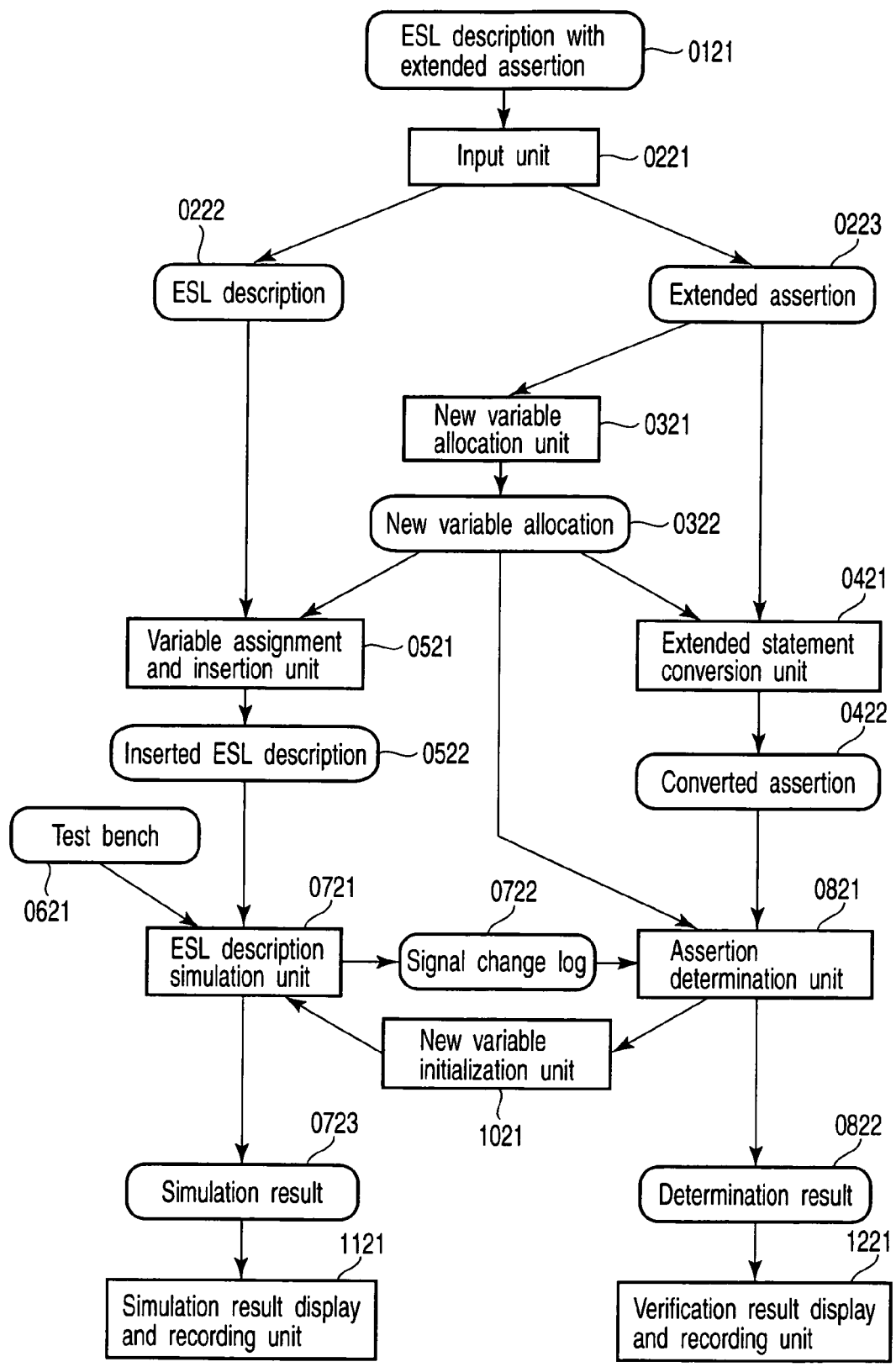
F I G. 1

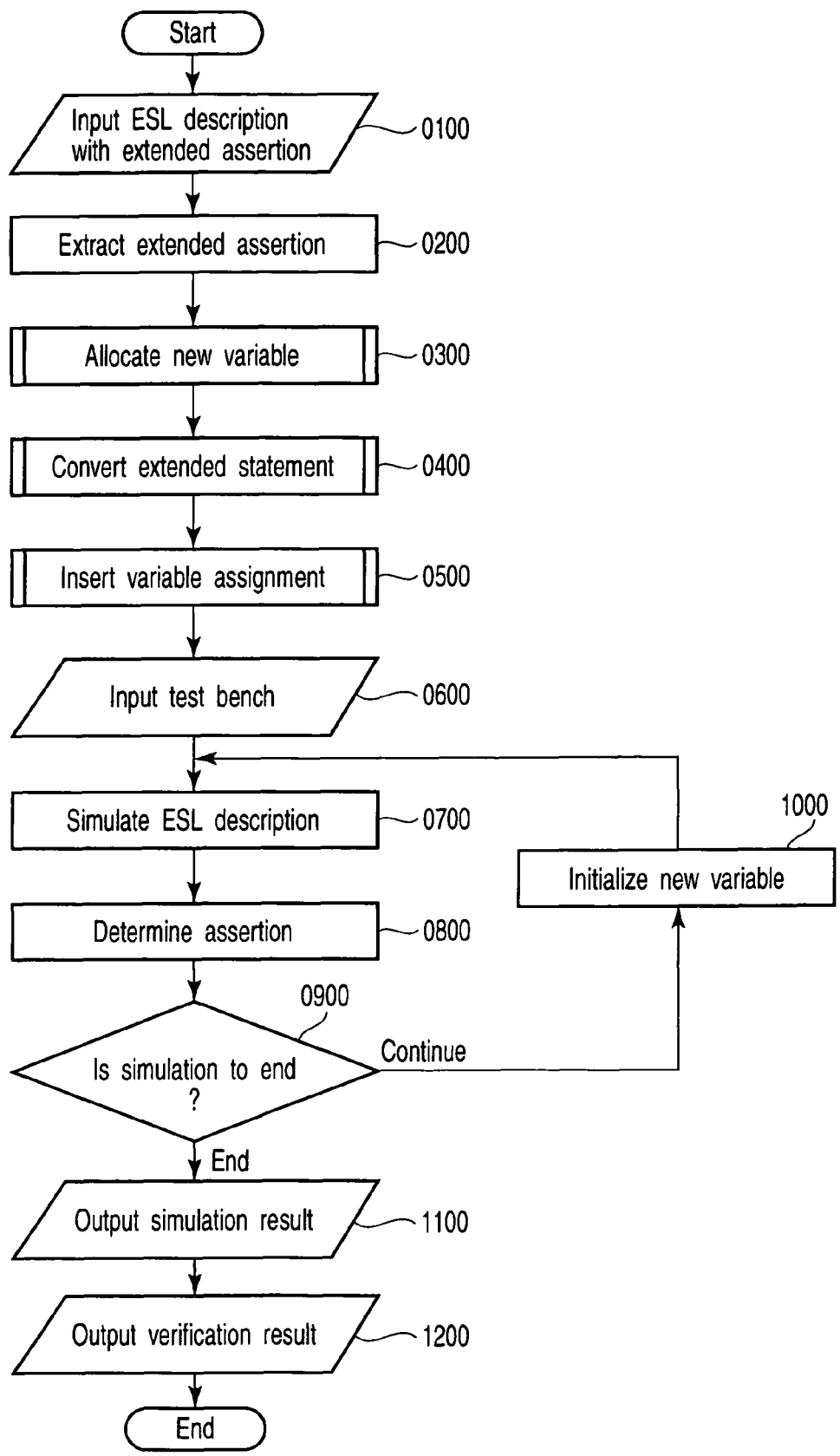
F I G. 2

```
1  behavior A {
2    B b;
3    void main () {
4      b.func (1);
5    }
6  }
7
8  behavior B {
9  // psl assert [enter (func); leave (func)];
10   int value;
11   void func (int v) {
12     waitfor (1) // Advance one clock
13     value = v;
14   }
15 }
```

```
1   behavior A {
2     B b;
3     void main () {
4       _enter_func_ = true;
5       b.func (1);
6       _leave_func = true;
7     }
8   }
9
10  behavior B {
11    int value;
12    void func (int v) {
13      waitfor (1) // Advance one clock
14      value = v;
15    }
16  }
```

```
1  behavior A {
2  B b;
3  void main () {
4    b.func2 ();
5    waitfor (1);
6    b.func (2);
7  }
8  }
9
10 behavior B {
11 // psl assert always (enter (func) -> next leave (func));
12 // psl assert {around (func2) && enter (func); leave (func)};
13 int value;
14 void func (int v) {
15   if (v = 1) {
16     waitfor (1) // Advance one clock
17   }
18   else {
19     waitfor (2); // Advance two clocks
20   }
21   value = v;
22 }
23
24 void func2 (void) {
25   func (1);
26 }
27 }
```

FIG. 10

```
1  behavior A {
2   B b;
3   void main () {
4     _around_func2_ = true;
5     b.func2 ();
6     _around_func2_ = false;
7     waitfor (1);
8     _enter_func_ = true;
9     b.func (2);
10    _leave_func_= true;
11  }
12 }
13
14 behavior B {
15  int value;
16  void func (int v) {
17    if (v = 1) {
18      waitfor (1) // Advance one clocks
19    }
20    else {
21      waitfor (2); // Advance two clocks
22    }
23    value = v;
24  }
25  void func2 (void) {
26    _enter_func_= true;
27    func (1);
28    _leave_func_= true;
29  }
30 }
```

FIG. 11 and VERIFICATION METHOD

CROSS-REFERENCE TO RELATED APPLICATIONS

This application is based upon and claims the benefit of priority from prior Japanese Patent Application No. 2007-171113, filed Jun. 28, 2007, the entire contents of which are incorporated herein by reference.

BACKGROUND OF THE INVENTION

1. Field of the Invention

The invention relates to an apparatus and method for performing verification using a property description language in design of an electronic system including digital circuits.

2. Description of the Related Art

Conventionally, an electronic system including digital circuits is designed using a low-level description (a description close to hardware such as signal lines, latches, and the like) called an HDL (Hardware Description Language). This method expresses inter-IP (Intellectual Property: soft assets, circuit components) communications and IP status management using signal lines. However, this method suffers problems, i.e., it requires a long design period and high cost.

In recent years, a method called ESL (Electronic System Level) design, which makes a circuit design using a design description language such as C or the like that allows a high-level description, begins to be used. The ESL design can express an inter-IP communication using a description with a high abstract level using function calls in place of signal lines. In this manner, the efficiency of a circuit design period and cost can be improved.

On the other hand, the HDL-based design begins to use a method using a description called "assertion". Assertions are formally described using a language called a property description language. PSL (Property Specification Language: IEEE1850) is an example of such language. According to the assertions, the IP behavior can be strictly and partially expressed using a description with a high abstract level. By checking if an event expressed by the assertion and that expressed by the IP design description using a simulation or static variation, the IP can be verified.

The property description that considers discrete time phases designates a generation order or interval of events to be generated in the IP. Since the conventional property description language is intended to be applied to HDL, it can only designate a change in signal line as an event. The ESL language often expresses the inter-IP communication as function calls as a description with a high abstract level in place of changes in signal line. Since the conventional property description language cannot designate events associated with function calls, it cannot express any behavior associated with a communication using the function calls.

A known example (for example, see JP-A Nos. 2007-94891 (KOKAI) and 2007-94591 (KOKAI)) that handles assertions described for the design description of the IP described using HDL does not solve a problem unique to the ESL design that cannot designate events associated with function calls.

Many studies about assertions have been made in languages such as C and the like used in the ESL design. However, these studies handle assertions for normal software. Therefore, they are not suited to use applications that handle assertions based on verification unit times such as clocks and the like unique to hardware including the ESL design.

As for application of assertions to the ESL design, NSCa (US2006/0277534) of JEDA is known. This known example is a method of performing verification by converting assertions for a general-purpose programming language into that programming language. However, function calls of the programming language are made from the assertions to describe the behavior with reference to return values, but a problem that the order of events associated with function calls cannot be designated remains unsolved.

BRIEF SUMMARY OF THE INVENTION

The invention has been made in consideration of the above situation, and has as its object to provide an apparatus and method which verify a design description of the IP using a property description language to which statements that designate events unique to the ESL design are added, so as to apply assertions to the ESL design.

A verification apparatus according to one aspect of the invention is a verification apparatus which verifies, at respective times on a discrete time series, a circuit description which describes a communication between circuit components, in which a signal value changes on a continuous time series, by a design description language that can describe using function calls. An allocation unit allocates a variable to a statement that designates an event associated with a function call in an assertion described in the property description language. Next, a value assignment unit detects generation of that event at an arbitrary time on the continuous time series, and assigns a value corresponding to the meaning of that statement to the variable. A determination unit then determines, based on the value of the variable at each time on the discrete time series, if a condition corresponding to the meaning of the statement is met.

BRIEF DESCRIPTION OF THE SEVERAL VIEWS OF THE DRAWING

FIG. 1 is a block diagram showing a verification apparatus according to embodiments;

FIG. 2 is a flowchart showing the operation sequence of the verification apparatus;

FIG. 10 is a view showing an example of an ESL description with extended assertions according to the second embodiment;

FIG. 11 is a view showing an example of an inserted ESL description according to the second embodiment.

DETAILED DESCRIPTION OF THE INVENTION

Figure 3:
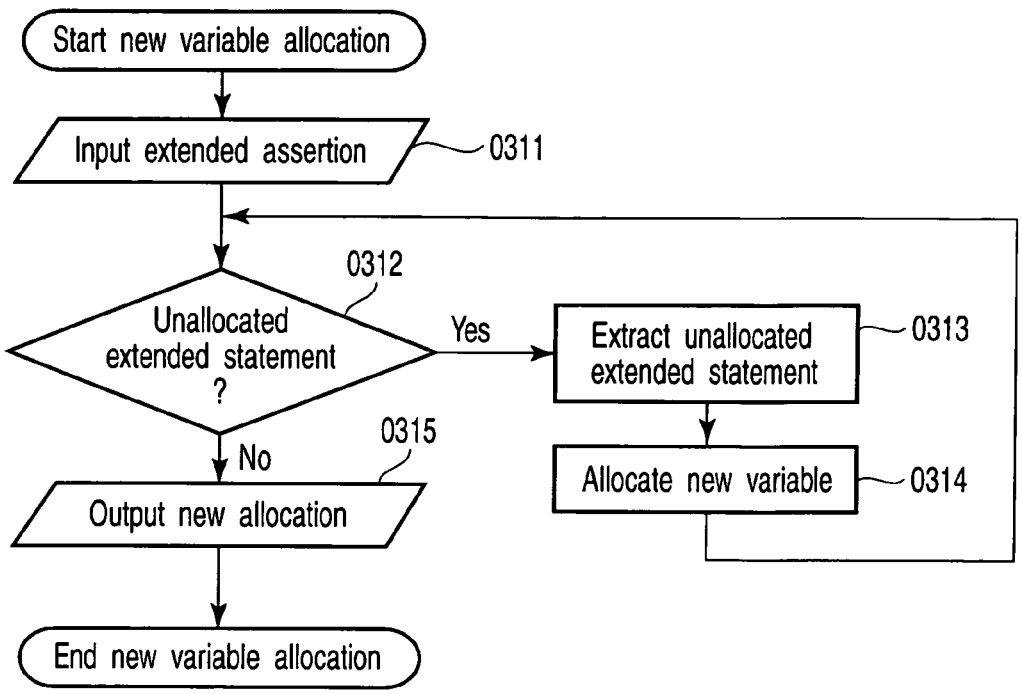
FIG. 3 is a flowchart showing a new variable allocation step.

Embodiments of a verification apparatus and verification method, which handle a property description language introduced with statements that designate events associated with function calls will be described. Allocation of new variables to respective statements that designate events associated with function calls, detection of events associated with function calls designated by statements, and interpretation of truth values expressed by statements according to the event detection results will be described hereinafter.

More specifically, a special new variable is allocated to each statement that designates an event associated with a function call to replace this statement by an event designation "this variable assumes a certain value". An assign statement that assigns a value to this variable is inserted at a position where a designated event is generated on the IP design description. Furthermore, upon verification of the property description language, whether or not a property is satisfied is verified at each clock, and processing for initializing the values of all the inserted variables is then executed.

(Terminology)

A timing at which true or false of a logical formula expressed by each property description (to be referred to as "assertion" hereinafter) is to be determined will be referred to as a "verification unit time" hereinafter. Normally, a timing at which a clock goes high is designated as a verification unit time.

A statement that designates an event associated with a function call will be referred to as "extended statement" hereinafter. The embodiments introduce three types of statements, i.e., a statement "enter" that designates an event generated by a function call, a statement "leave" that designates an event after a function call ends, and a statement "around" that designates an arbitrary event generated during a function call. These names "enter", "leave", and "around" are merely examples, and other names may be used.

The statement "enter" is a statement which goes true at a verification unit time immediately after the designated function call starts. For example, "enter(func)" goes true at a verification unit time immediately after a call of a function "func" starts. The statement "leave" goes true at a verification unit time immediately after the designated function call ends. For example, "leave(func)" goes true at a verification unit time immediately after a call of the function "func" ends. The statement "around" goes true at an arbitrary verification unit time after the designated function is called until its processing ends. For example, "around(func)" goes true at an arbitrary verification unit time after the function "func" is called until its processing ends.

An assertion including an extended statement will be referred to as "extended assertion" hereinafter. In the embodiments, the extended statement is converted into a normal assertion by replacing it by a normal variable comparison, and this normal assertion will be referred to as "converted assertion" hereinafter.

In the embodiments, variables are allocated to all extended statements in an input extended assertion. The variable to be allocated will be referred to as "new variable" hereinafter. Also, a set of the extended statement and allocated new variable will be referred to as "variable allocation" hereinafter.

A source code described using an ESL language will be referred to as "ESL description" hereinafter. In the embodiments, an assign statement is inserted in the ESL description, and the ESL description that has undergone the insertion processing will be referred to as an "inserted ESL description" hereinafter.

(Basic Arrangement of System)

Referring to FIG. 1, a verification apparatus includes an input unit 0221 which receives an ESL description 0121 with an extended assertion, separates it into an ESL description 0222 and extended assertion 0223, and outputs them, a new variable allocation unit 0321 which allocates new variables to extended statements in the extended assertion 0223, an extended statement conversion unit 0421 which converts the extended assertion 0223 into a converted assertion 0422 by converting the extended statements into variable comparisons based on variable allocations, a variable assignment and insertion unit 0521 which inserts assign statements, that assign values to the variables allocated to the extended statements, at positions designated by all the extended statements, an ESL description simulation unit 0721 which executes an inserted ESL description 0522 with respect to a test bench 0621, an assertion determination unit 0821 which determines true or false of each logical formula in the converted assertion 0422 with respect to a signal change log 0722 of the ESL description simulation unit 0721, and executes a designated operation such as an error output, statistic recording, or the like upon determination of false, a new variable initialization unit 1021 which initializes the new variables, a simulation result display and recording unit 1121 which displays and records a simulation result 0723, and a verification result display and recording unit 1221 which displays and records an assertion determination result 0822.

As shown in FIG. 2, the input unit 0221 inputs an ESL description with an extended assertion (step 0100), separates and extracts an extended assertion and ESL description from the ESL description with the extended assertion, and outputs them (step 0200).

The new variable allocation unit 0321 allocates new variables to extended statements included in the extended assertion (step 0300). The extended statement conversion unit 0421 converts the extended statements into variable comparisons based on variable allocations obtained in the previous step (step 0400). On the other hand, the variable assignment and insertion unit 0521 inserts variable assignments into the ESL description based on the variable allocations (step 0500).

A test bench is input in step 0600, and the ESL description simulation unit 0721 simulates the ESL description until the next verification unit time (step 0700). As a result, the simulation result of the ESL description is obtained.

On the other hand, the assertion determination unit 0821 performs assertion determination based on the converted assertion (step 0800). As a result, the assertion determination result (i.e., the verification result) is obtained.

It is then checked in step 0900 if the simulation is to end. If the simulation is not to end but it is continued, the new variable initialization unit 1021 initializes the new variables (step 1000), and the process returns to step 0700. If the simulation is to end, the simulation result display and recording unit 1121 outputs the simulation result (step 1100), and the verification result display and recording unit 1221 outputs the verification result (step 1200).

Note that the order of steps which have no dependence on input and output data may be interchanged, or such steps may be executed in parallel. More specifically, the following three changes are available.

Steps 0400 and 0500 may be interchanged or may be executed in parallel.

The order of step 0600 may be changed to that before step 0100, 0200, 0300, 0400, or 0500, or step 0600 may be executed parallel to these steps.

Steps 1100 and 1200 may be interchanged or may be executed in parallel.

(Details of New Variable Allocation Step 0300)

New variable allocation step 0300 is a step of allocating new variables to all extended statements in the extended assertion. As shown in FIG. 3, step 0300 includes step 0311 of inputting the extended assertion, steps 0312 and 0313 of searching for an extended statement to which a new variable is to be allocated, step 0314 of generating a new variable and allocating it to the extended statement, and step 0315 of outputting variable allocations. As described above, a set of a extended statement and new variable allocated to it is a "variable allocation". The variable allocations are temporarily stored in a storage unit such as a memory, hard disk, or the like (to be referred to as a "variable allocation storage unit" hereinafter, although not shown).

(Details of Extended Statement Conversion Step 0400)

Figure 4:
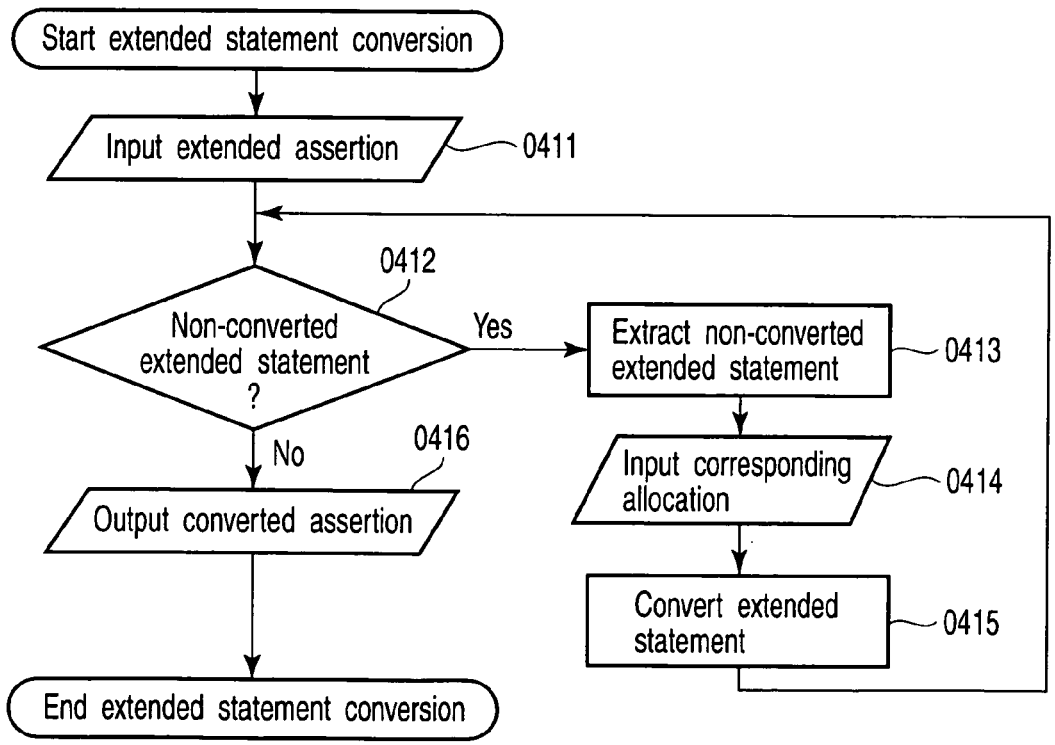
FIG. 4 is a flowchart showing an extended statement conversion step.

Extended statement conversion step 0400 is a step of converting the extended assertion into the converted assertion. As shown in FIG. 4, step 0400 includes step 0411 of inputting the extended assertion, step 0412 and 0413 of searching for an extended statement to be converted, step 0414 of inputting a variable allocation corresponding to the extended statement, step 0415 of converting the extended statement into an allocated variable comparison, and step 0416 of outputting the converted assertion obtained by converting all the extended statements. The output converted assertion is temporarily stored in a storage unit such as a memory, hard disk, or the like (to be referred to as a "converted assertion storage unit" hereinafter, although not shown).

(Details of Variable Assignment and Insertion Step 0500)

Figure 5:
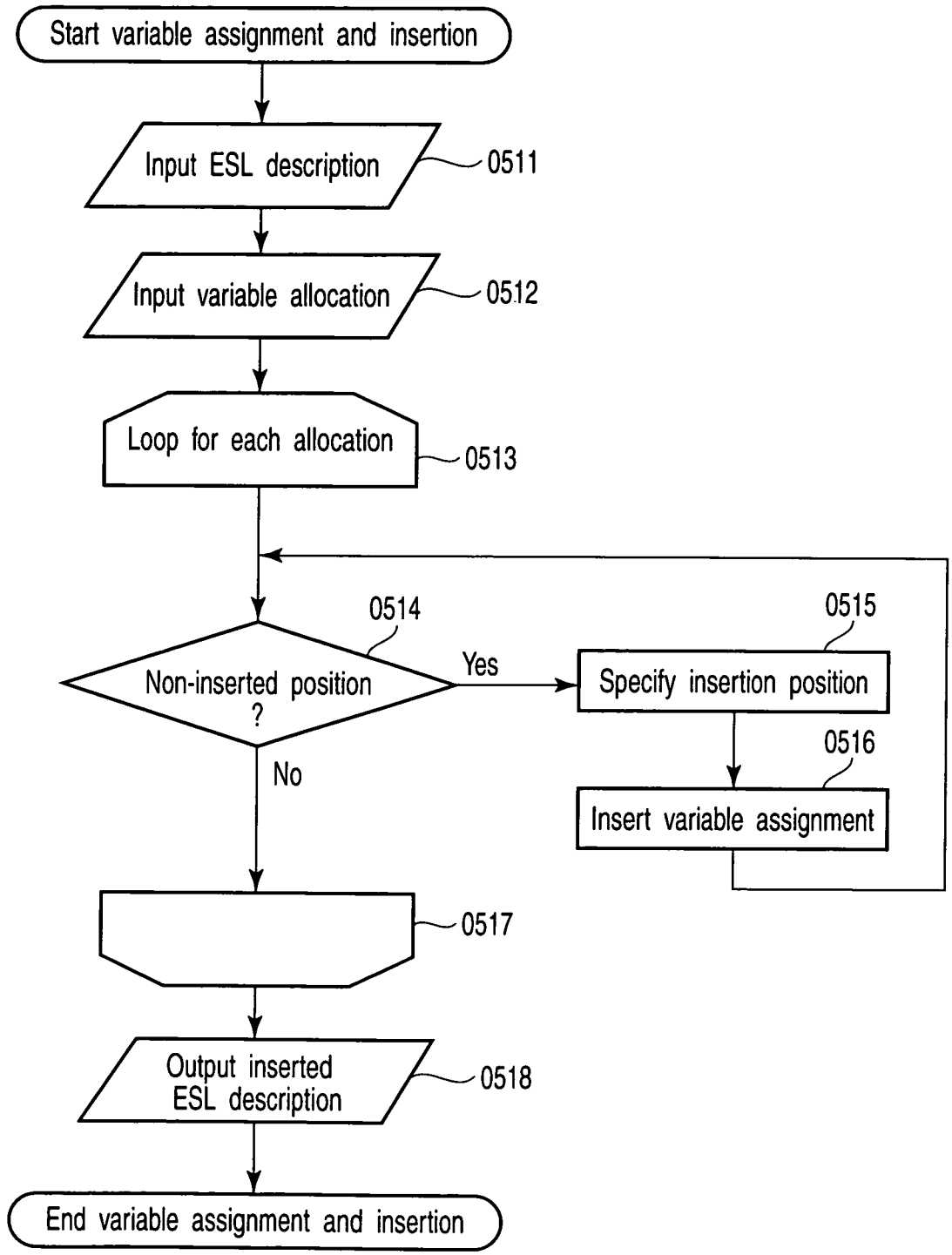
FIG. 5 is a flowchart showing a variable assignment and insertion step.

Variable assignment and insertion step 0500 is a step of inserting required assign statements into the ESL description. As shown in FIG. 5, step 0500 includes step 0511 of inputting the ESL description, step 0512 of inputting all variable allocations, steps 0513 and 0517 of repeating processing for each variable allocation, steps 0514 and 0515 of searching for a position at which an event corresponding to the extended statement of the variable allocation is to be generated, and which is to undergo insertion processing, step 0516 of inserting an assign statement that executes assign processing into a variable corresponding to the variable allocation at that position, and step 0518 of outputting the inserted ESL description in which all the variable allocations have undergone the insertion processing.

(Meaning of Extended Statement)

Figures 6, 7:
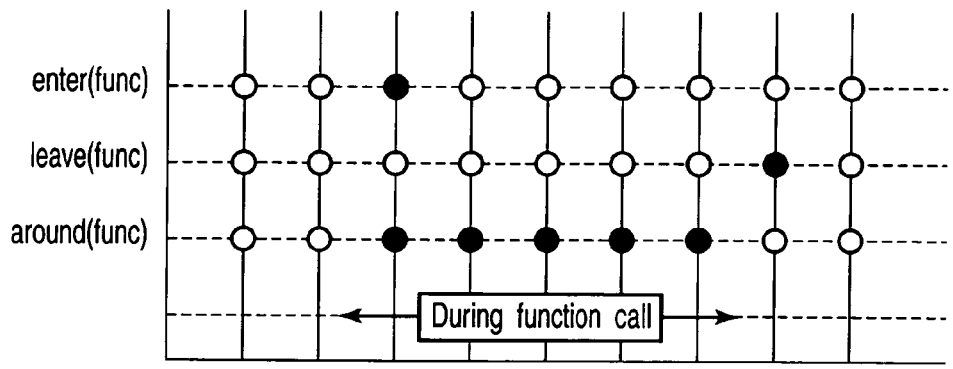
FIG. 6 is a view for explaining the meanings of extended statements.
FIG. 7 is a view showing an example of an ESL description with an extended assertion according to the first embodiment.

FIG. 6 shows the meanings of the three types of extended statements "enter", "leave", and "around". In FIG. 6, an open circle represents false, and a full circle represents true. The statement "enter(func)" goes true only at a verification unit time immediately after a call of "func". The statement "leave (func)" goes true only at a verification unit time immediately after execution of "func" ends. The statement "around(func)" goes true at all verification unit times during calling of "func".

(First Embodiment)

The first embodiment that simulates and verifies an ESL description with an extended assertion will be described hereinafter.

FIG. 7 shows an ESL description which expresses a circuit that combines two IP A and IP B, and is described using a language based on SpecC. Note that the ESL language is not limited to SpecC. A block from the first line to the sixth line and starting from "behavior A" represents IP A, and a block from the eighth line to the 15th line and starting from "behavior B" represents IP B. IP A transfers a value to IP B by calling a function func of IP B from IP A. Furthermore, upon completion of execution of the function "func", IP B notifies IP A of reception of the value.

An extended assertion which describes that IP B receives a value at the 0th clock and returns a notification at the first clock is described as {enter(func); leave(func)} by a language obtained by adding extended statements to the PSL language (Property Specification Language) as the existing property description language. The processing sequence of verifying this assertion will be described below.

(Operation in New Variable Allocation Step 0300 in First Embodiment)

In new variable allocation step 0300, the extended assertion {enter(func); leave(func)} is input, and new variables are respectively allocated to two extended statements "enter (func)" and "leave(func)" in this extended assertion. In this embodiment, assume that a new variable "_enter_func_" is allocated to "enter(func)", and a new variable "_leave_func_" is allocated to "leave(func)". Also, these new variables are initialized by "false". Note that an initial value="false" is merely an example, and it does not limit the invention. Also, variable names of these new variables are examples, and other names may be used.

Furthermore, names need not be actually given as long as their entities can be distinguished from other new variables or variables originally included in the ESL description.

(Operation in Extended Statement Conversion Step 0400 in First Embodiment)

In extended statement conversion step 0400, the extended assertion {enter(func); leave(func)} is input, and the two extended statements "enter(func)" and "leave(func)" in this extended assertion are converted into descriptions of variable comparison. In this embodiment, "enter(func)" is converted into a description of comparison "_enter_func_==true", and "leave(func)" is converted into a description of comparison "_leave_func_==true". A value to be compared=true is merely an example, and does not limit the invention. Any other values may be used as long as they can be distinguished from "false" as an initial value. The description of variable comparison includes a description of comparison between a variable and literal, and that of comparison between values of variables. By extended statement conversion step 0400, the extended assertion {enter(func); leave(func)} is converted into a converted assertion {_enter_func_==true; _leave_func_==true}.

(Operation in Variable Assignment and Insertion Step 0500 in First Embodiment)

Figures 8, 9:
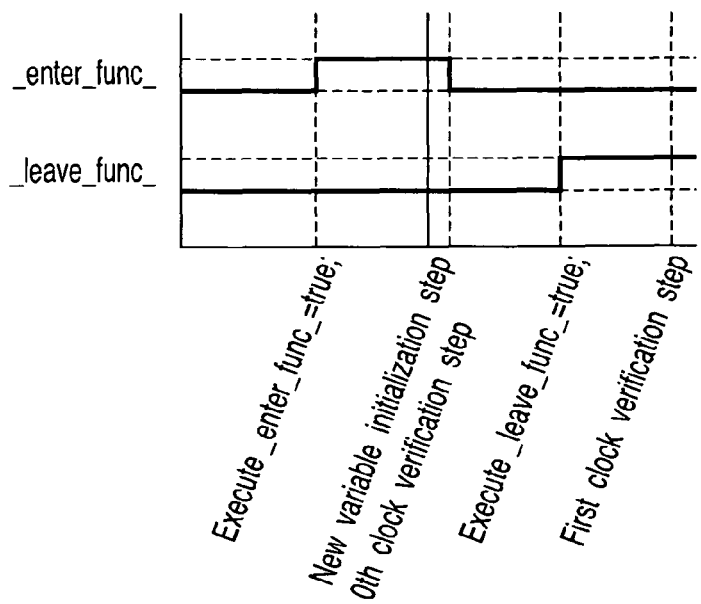
FIG. 8 is a view showing an example of an inserted ESL description according to the first embodiment.
FIG. 9 is a timing chart showing changes in value of new variables according to the first embodiment.

In variable assignment and insertion step 0500, the ESL description shown in FIG. 7 is input, and descriptions of variable assignment are inserted based on the two variable allocations generated in step 0300. More specifically, an assign statement "_enter_func_=true;" is inserted immediately before a call of a function "func" in the ESL description, based on the first variable allocation [enter(func), _enter_func_]. Also, an assign statement "_enter_func_=false;" is inserted immediately after the call of the function "func" in the ESL description, based on the second variable allocation [leave(func), _leave_func_]. As a result, an inserted ESL description shown in FIG. 8 is obtained. Note that the processing for inserting a description of variable assignment is equivalent to processing for detecting generation of an event associated with a function call at an arbitrary time on a continuous time series, and reflecting generation of the event in correspondence with the meaning of an extended statement. "Reflecting" means that a value assignment unit corresponding to the variable assignment and insertion unit 0521 assigns a value to a new variable in correspondence with the meaning of an extended statement.

(Operations in ESL Description Simulation Step 0700, Assertion Determination Step 0800, Step 0900 of Checking if Simulation is to End, and New Variable Initialization Step 1000 in First Embodiment)

In ESL description simulation step 0700, the inserted ESL description shown in FIG. 8 is simulated to check if the converted assertion {_enter_func_==true;

leave_func_==true} generated in extended statement conversion step 0400 is satisfied. In the first embodiment, since the circuit does not input any test bench, no test bench is available. In first ESL description simulation step 0700, a simulation is executed until execution of a function "main" of IP A starts, "_enter_func_" goes "true" by "_enter_func_=true;", a function "func" of IP B is called by "b.func(1);", and "waitfor (1)" is called. In assertion determination step 0800, it is confirmed if a condition "_enter_func_==true" to be satisfied at the 0th clock is satisfied. In step 0900 of checking if the simulation is to end, prosecution of the simulation is decided since processing that waits for the next clock exists. In new variable initialization step 1000, initialization is executed by assigning "false" to both the new variables "_enter_func_" and "_leave_func_". As a result, the new variables go true only at the next verification unit time after generation of the corresponding event.

In ESL description simulation step 0700, the simulation is executed until execution returns from "waitfor(1)", execution returns from the function "func" after a value received from IP A is saved in a variable "value" in IP B, "_leave_func_" goes "true" by "_leave_func_=true;", and execution of the function "main" of IP A ends.

In assertion determination step 0800, it is confirmed if a condition "_leave_func_==true" to be satisfied at the first clock is satisfied. In step 0900 of checking if the simulation is to end, since there is no function which is being executed, the simulation ends. In simulation result output step 1100, the simulation result is output. However, since the ESL description according to the first embodiment is the circuit which does not generate any external output, nothing is output and the simulation ends. In verification result output step 1200, the assertion verification result is output. In this step, it is output that the description satisfies all assertions.

With the aforementioned steps, it is verified that the ESL description shown in FIG. 7 satisfies the extended assertion {enter(func); leave(func)}.

(Variation of Value of New Variable in First Embodiment)

FIG. 9 shows what values the new variables assume as a chart on the continuous time series in the first embodiment. During an interval from the beginning of simulation until a verification step of the 0th clock, "_enter_func_=true;" is executed, and "_enter_func_" assumes "true" and "_leave_func_" assumes "false" at the time of the verification step of the 0th clock. That is, this indicates that "enter(func)" is true and "leave(func)" is false in the verification of the 0th clock on the discrete time series defined in the property description language. After completion of the verification of the 0th clock, the new variables are initialized, "leave(func)=true;" is executed before a verification step of the first clock, and "_enter_func_" assumes "false" and "_leave_func_" assumes "true" at the time of the verification step of the first clock. That is, this indicates that "enter(func)" is false and "leave(func)" is true in the verification of the first clock on the discrete time series defined in the property description language.

(Operation of Verification Apparatus According to First Embodiment)

The input unit 0221 inputs the ESL description shown in FIG. 7, and separates it into an ESL description and extended assertion, thereby extracting them.

The new variable allocation unit 0321 allocates new variables "_enter_func_" and "_leave_func_" to respective extended statements described in the extended assertion{enter(func); leave(func)}. The unit 0321 temporarily stores sets of extended statements and new variables, i.e., variable allocations in a storage unit such as a memory, hard disk, or the like. Based on these variable allocations, the extended statement conversion unit 0421 converts the extended assertion{enter(func); leave(func)} into a converted assertion {_enter_func_==true; _leave_func_==true}. The variable assignment and insertion unit 0521 converts the ESL description shown in FIG. 7 into the inserted ESL description shown in FIG. 8 based on the variable allocations. The ESL description simulation unit 0721 simulates the inserted ESL description shown in FIG. 8. The unit 0721 simulates from the beginning of execution of the function "main" of IP A until calling of "waitfor(1)" in the function "func" of IP B in simulation of the 0th clock, and sends a signal change log 0722 of this state to the assertion determination unit 0821. The signal change log 0722 represents how the values of "_enter_func_" and "_leave_func_" change. The assertion determination unit 0821 determines based on the signal change log 0722 that the converted assertion {_enter_func_==true; _leave_func_==true} is satisfied under the present situation (i.e., a verification unit time).

Next, the new variable initialization unit 1021 initializes "_enter_func_" and "_leave_func_" to "false". The ESL description simulation unit 0721 simulates from returning from calling of "waitfor(1)" until the end of the function "main" of IP A in the simulation of the first clock, and sends a signal change log 0722 of this state to the assertion determination unit 0821. The assertion determination unit 0821 determines based on the signal change log 0722 that the converted assertion {_enter_func_==true; _leave_func_==true} is satisfied under the present situation.

The new variable initialization unit 1021 initializes "_enter_func_" and "_leave_func_" to "false". The simulation ends at this timing. The simulation result display and recording unit 1121 outputs, displays, and stores the simulation result, and the verification result display and recording unit 1221 outputs, displays, and stores the assertion verification result.

(Second Embodiment)

The second embodiment that simulates and verifies an ESL description with an extended assertion will be described hereinafter.

FIG. 10 shows an ESL description that expresses a circuit by combining two IP A and IP B. By calling functions "func2" and "func" of IP B from IP A, IP A transfers a value to IP B. The function "func2" in IP B calls the function "func" of itself. When the transferred value is "1", the function "func" returns the process after one clock; when the value is "2", it returns the process after two clocks.

The second embodiment which verifies two extended assertions "always(enter(func)->next leave(func))" and {around(func2)&&enter(func); leave(func)} at that time will be described focusing on differences from the first embodiment. The first assertion represents that execution of the function "func" always ends at a clock next to that at which the function "func" is called. This assertion is true when the function "func" is called via the function "func2" of IP B. However, this assertion is false when the function "func" is directly called as "b.func(2)" from a function "main" of IP A, since execution of the function ends after two clocks. The second assertion represents that the function "func" is called during calling of the function "main" of IP A at the 0th clock, and execution of the function "func" ends at the first clock. This assertion holds.

(Operation in New Variable Allocation Step 0300 in Second Embodiment)

In new variable allocation step 0300, "_enter_func_" is allocated to "enter(func)", "_leave_func_" is allocated to "leave(func)", and "_around_func2_" is allocated to "around (func2)".

(Operation in Extended Statement Conversion Step 0400 in Second Embodiment)

In extended statement conversion step 0400, the first extended assertion "always(enter(func)->next leave(func))" is converted into "always(_enter_func_==true->next _leave_func_==true)", and the second extended assertion {around(func2)&&enter(func); leave(func)} is converted into {_around_func2_==true && _enter_func_==true; _leave_func_==true}. As in the first embodiment, each extended statement is converted into a description of variable comparison.

(Operation in Variable Allocation and Insertion Step 0500 in Second Embodiment)

In variable allocation and insertion step 0500, the ESL description shown in FIG. 10 is converted into an inserted ESL description shown in FIG. 11. For "around(func2)", "_around_func2_=true;" is inserted at the beginning of calling of a function, and "_around_func2_=false;" is inserted at the end of calling.

(Operations in ESL Description Simulation Step 0700, Assertion Determination Step 0800, Step 0900 of Checking if Simulation is to End, and New Variable Initialization Step 1000 in Second Embodiment)

In ESL description simulation step 0700, the inserted ESL description shown in FIG. 11 is simulated. Note that the new variables corresponding to "enter" and "leave" are initialized after determination of the assertions, but that corresponding to "around" is not initialized. As a result, the new variable always goes true during execution of the function designated by "around".

After completion of the simulation of the 0th clock, "enter (func)" and "around(func2)" are true. The first extended assertion "always(enter(func)->next leave(func))" verifies if "enter(func)" becomes "leave(func)" at the next clock. The second extended assertion {around(func2)&&enter(func); leave(func)} verifies an event which is to go true at the 0th clock is true. After completion of the simulation of the first clock, "leave(func)" is true. The first extended assertion does not go false at that time, since "leave(func)" is true. For the second assertion, it is verified if an event which is to go true at the first clock is true, and it is settled that this assertion is true. At the second clock, "enter(func)" goes true. The first extended assertion verifies if "enter(func)" becomes "leave (func)" at the next clock. At the third clock, since a value passed to the function "func" at that time is "2", a waiting state of the second clock is set. For this reason, the function "func" does not return yet, and there is no extended statement that goes true. As a result, the first extended assertion "always (enter(func)->next leave(func))" goes false. "assert" as an operation at the time of false of that assertion means that an error is output, and an error output is executed.

(Variation of Value of New Variable in Second Embodiment)

Figure 12:
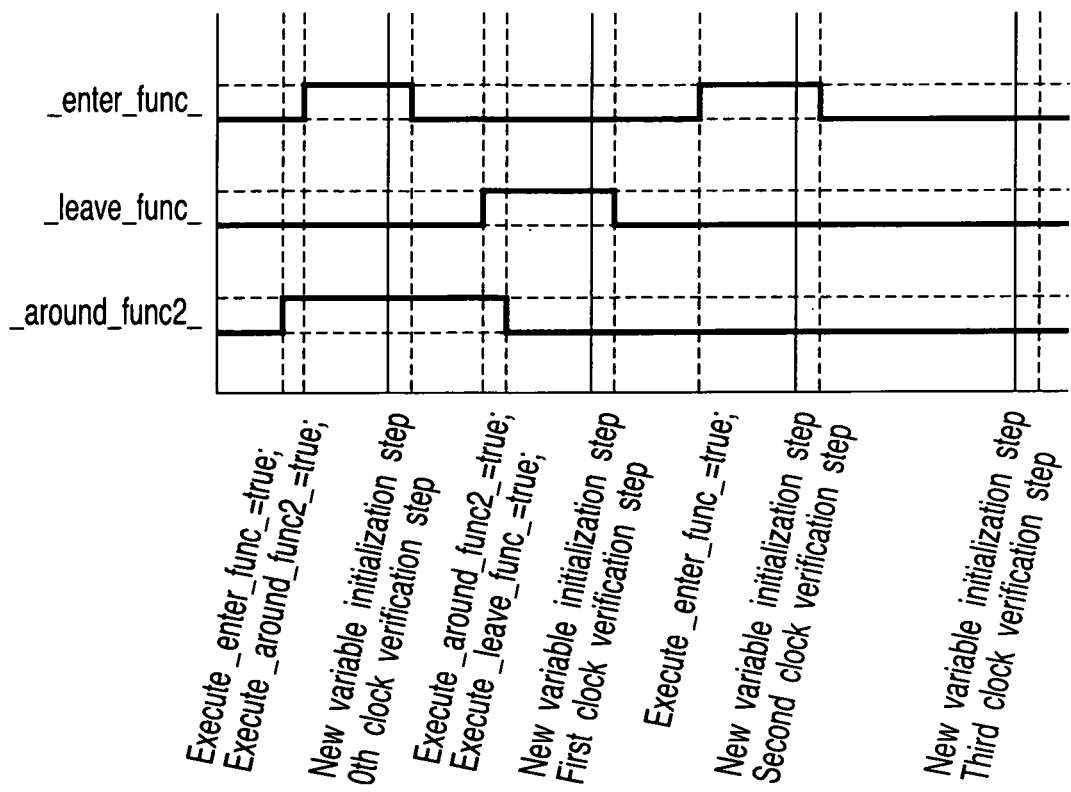
FIG. 12 is a timing chart showing changes in value of new variables according to the second embodiment.

FIG. 12 shows what values the new variables assume as a chart on the continuous time series in the second embodiment.

According to the aforementioned embodiments, a development environment that allows the ESL design to use assertions, and has description capability with a high abstract level and verification capability by the assertions can be provided.

The aforementioned embodiments can be modified as follows.

(Modifications)

The extended assertion and ESL description may be independently described in advance. In this case, extended assertion extraction step 0200 can be omitted.

New variables need not be respectively allocated to a plurality of extended statements that designate the same timing in the ESL description. For example, when functions "func1" and "func2" are successively called all the time, if "leave(func1)" and "enter(func2)" appear in an extended assertion, new variables need not be respectively allocated to them. By expanding the function to detect such situation and to allocate the same new variable to "leave(func1)" and "enter(func2)", the number of assign statements to be inserted into the ESL description can be reduced, and the simulation can be speeded up.

In FIG. 2, new variable allocation step 0300, extended statement conversion step 0400, and variable assignment and insertion step 0500 are executed as pre-processes of ESL description simulation step 0700. However, the processing sequence may be modified to perform conversion and determination as needed while executing the simulation. For example, if the meaning of a function call is extended so that processing for assigning true to a new variable corresponding to that function before normal calling is added, when a function "func" is called in the simulation step, since "true" is assigned to "_enter_func_", variable assignment and insertion step 0500 can be omitted. However, this method can be used only when the ESL description simulation unit 0721 is implemented by a method of sequentially interpreting and executing the ESL description.

New variable initialization step 1000 is executed in the loop of ESL description simulation step 0700, assertion determination step 0800, and step 0900 of checking if a simulation is to end. However, before ESL description simulation step 0700, a step of detecting a position corresponding to that immediately after a verification unit time in the ESL description, and inserting an assign statement that initializes new variables may be executed.

In the above description, variable assignment and insertion step 0500 inserts variable assignments into the ESL description. However, when a simulator is implemented by a method of executing the ESL description after compiling it into an object code, object code segments corresponding to variable assignments may be inserted into the object code simultaneously with or after compiling. However, it should be noted that a function is likely to be inline-extended due to optimization of a compiler.

If no new variable is explicitly given to interpretation of the extended statement "around" that represents an arbitrary verification unit time from when the designated function is called until its processing ends, since equivalent information is recorded in a function call stack upon execution, that information may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A verification apparatus, which verifies, at respective times on a discrete time series, a circuit description that describes a communication between circuit components, in which a signal value changes on a continuous time series, by a design description language that describes the communication as a function call, the apparatus comprising:
    an allocation device configured to allocate a new variable to an extended statement that designates an event associated with the function call in an extended assertion described using a property description language;
    a conversion device configured to convert the extended statement into a formula that expresses a condition using the new variable;
    a value assignment device configured to detect generation of the event at an arbitrary time on the continuous time series, and to assign a value corresponding to a meaning of the extended statement to the new variable so that a description of variable assignment is inserted in the circuit description;
    a simulation device configured to simulate the circuit description in which the description of variable assignment is inserted; and
    a determination device configured to determine based on the value of the new variable at each time on the discrete time series if the condition corresponding to the meaning of the extended statement is satisfied.

2. The apparatus according to claim 1, further comprising an initialization device configured to initialize the value of the new variable immediately after determination of the condition.

3. The apparatus according to claim 2, wherein the description of variable assignment is inserted at a position of an instruction that generates the event in the circuit description.

4. The apparatus according to claim 1, wherein the extended statement includes a statement which designates start of the function call.

5. The apparatus according to claim 1, wherein the extended statement includes a statement which designates end of the function call.

6. The apparatus according to claim 1, wherein the extended statement includes a statement which designates that the function call is in process.

7. The apparatus according to claim 1, wherein the simulation device outputs a signal change log which represents a change in value of the new variable, and
    in which the condition is determined based on the signal change log.

8. The apparatus according to claim 1, wherein each time on the discrete time series is a verification unit time corresponding to a timing at which true or false of a logical formula expressed by the assertion is to be determined.

9. A verification method of verifying, at respective times on a discrete time series, a circuit description that describes a communication between circuit components, in which a signal value changes on a continuous time series, by a design description language that describes the communication as a function call, comprising:
    allocating, at an allocation device, a new variable to an extended statement that designates an event associated with the function call in an extended assertion described using a property description language;
    converting, at a conversion device, the extended statement into a formula that expresses a condition using the new variable;
    detecting, at a value assigning device, generation of the event at an arbitrary time on the continuous time series;
    assigning, at the value assigning device, a value corresponding to a meaning of the extended statement to the new variable so that a description of variable assignment is inserted in the circuit description;
    simulating, at a simulation device, the circuit description in which the description of variable assignment is inserted; and
    determining, at a determination device, based on the value of the new variable at each time on the discrete time series if the condition corresponding to the meaning of the extended statement is satisfied.

10. The method according to claim 9, further comprising:
    initializing, at an initialization device, the value of the new variable immediately after determination of the condition.

11. The method according to claim 10, wherein the description of variable assignment is inserted at a position of an instruction that generates the event in the circuit description.

12. The method according to claim 9, wherein the extended statement includes a statement which designates start of the function call.

13. The method according to claim 9, wherein the extended statement includes a statement which designates end of the function call.

14. The method according to claim 9, wherein the extended statement includes a statement which designates that the function call is in process.

15. The method according to claim 9, wherein the simulating, at the simulation device comprises
    outputting, at the simulation device, a signal change log which represents a change in value of the new variable, and
    wherein the condition is determined based on the signal change log.

16. The method according to claim 9, wherein each time on the discrete time series is a verification unit time corresponding to a timing at which true or false of a logical formula expressed by the assertion is to be determined.

17. The method according to claim 16, wherein the verification unit time is a timing at which a clock of the circuit component goes high.

18. A non-transitory computer readable storage medium storing instructions of a computer program for verifying, at respective times on a discrete time series, a circuit description that describes a communication between circuit components, in which a signal value changes on a continuous time series, by a design description language that describes the communication as a function call, which when executed by a computer results in performance of steps comprising:
    allocating a new variable to an extended statement that designates an event associated with the function call in an extended assertion described using a property description language;
    converting the extended statement into a formula that expresses a condition using the new variable;
    detecting generation of the event at an arbitrary time on the continuous time series, and assigning a value corresponding to a meaning of the extended statement to the new variable so that a description of variable assignment is inserted in the circuit description;
    simulating the circuit description in which the description of variable assignment is inserted; and
    determining based on the value of the new variable at each time on the discrete time series if the condition corresponding to the meaning of the extended statement is satisfied.

* * * * *